(12) United States Patent
Uenishi et al.

(10) Patent No.: US 6,617,896 B2
(45) Date of Patent: Sep. 9, 2003

(54) COMPLEMENTARY SIGNAL GENERATION CIRCUIT

(75) Inventors: Yasutaka Uenishi, Kanagawa (JP); Mikio Aoki, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/162,170

(22) Filed: Jun. 5, 2002

(65) Prior Publication Data

US 2002/0186060 A1 Dec. 12, 2002

(30) Foreign Application Priority Data

Jun. 8, 2001 (JP) ........................................ 2001-173533

(51) Int. Cl.[7] .............................................. H03K 5/12
(52) U.S. Cl. ....................... 327/170; 327/333; 327/218; 326/68; 326/81
(58) Field of Search ........................ 327/170, 108–112, 327/379, 389, 391, 333, 215, 218, 219; 326/68, 81, 83, 26, 27

(56) References Cited

U.S. PATENT DOCUMENTS 6,163,170 A * 12/2000 Takinomi .................... 326/61

FOREIGN PATENT DOCUMENTS

JP   3-258015   11/1991

* cited by examiner

*Primary Examiner*—Terry D. Cunningham
*Assistant Examiner*—Long Nguyen
(74) *Attorney, Agent, or Firm*—Foley & Lardner

(57) ABSTRACT

Disclosed is a complementary signal generation circuit that can suppress the distortion of an eye pattern due to a change in signal delay caused by jitter or a change in the rise and fall of a signal caused by a manufacturing factor. An inverter 11 inverts an input signal 101 and generates a first internal signal 104, and an inverter 12 inverts the first internal signal 104 and generates a second internal signal 105. When the first internal signal 104 goes high, a flip-flop 1 reduces the level of an in-phase signal 103 to low, and increases the level of an antiphase signal 102 to high. Thus, when the fall of the in-phase signal is delayed, the flip-flop also delays the rise of the antiphase signal and suppresses the distortion of the eye pattern. And when the ON resistances of transistors Qn1 and Qn2 are changed due to a manufacturing factor, RC series circuits 2 and 3 suppress the change in the driving capability.

10 Claims, 11 Drawing Sheets

FIG.8

| DELAY TIME [nsec] | CIRCUIT IN FIG.2 | | CIRCUIT IN FIG.4 | |
|---|---|---|---|---|
| | $T_{HH}$ | $T_{LL}$ | $T_{HH}$ | $T_{LL}$ |
| RESULTS OBTAINED UNDER THE SLOW CONDITION | 0.1941 | 0.1388 | 0.119 | 0.135 |
| RESULTS OBTAINED UNDER THE FAST CONDITION | 0.1228 | 0.0445 | 0.0524 | 0.0585 |
| VARIANCE VALUE | 0.0713 | 0.0943 | 0.0666 | 0.0768 |

COMPLEMENTARY SIGNAL GENERATION CIRCUIT

BACKGROUND OF THE INVENTION

1. Field of the Invention

The present invention relates to a complementary signal generation circuit, and relates in particular to a complementary signal generation circuit for receiving a signal and for generating, for the input signal, a complementary signal that includes an in-phase signal and an antiphase signal.

2. Description of the Prior Arts

Recently, signal transfer speeds have been increased, and fast operations exceeding 1 GHz are required for an input/output buffer. LVDS (Low-Voltage Differential Signaling), known as a fast signal transmission/reception circuit, is a technique employed for transferring data using a complementary signal that includes an in-phase signal and an antiphase signal having a small amplitude of about 0.4 V. LVDS is characterized by providing excellent noise resistance, low power consumption and high-speed operation; however, LVDS also has two problems. The first problem is waveform distortion caused by jitter, and the second problem is waveform distortion due to the fluctuation of a transistor characteristic, such as a threshold voltage, that is caused by the primary manufacturing factor.

According to the first problem, since with LVDS complementary signals are transmitted along a pair of signal lines, not only does jitter occur in a reception circuit, but also the jitter may cause the phase of a complementary input signal to shift in the opposite direction, so that it is difficult for an output signal cross point, a term used to designate a point whereat an in-phase signal and an antiphase signal intersect, to be located and maintained near a position representing 50% of the amplitude of the signals.

Generally, eye pattern standards are specified for a fast interface, such as SONET/SDH, InfiniBand or FiberChannel, and cross point locations are set so they are near locations representing 50% of the amplitude of signals. An eye pattern method is employed to observe a target signal by superimposing an eye pattern on a clock cycle. Using this method, it is possible to efficiently observe the waveform distortion of an input signal and the fluctuation of an output waveform that are caused, for example, by jitter or a signal delay that occurs as the result of amplification. FIG. 1A is a diagram showing the fluctuation of an output waveform due to jitter and a shaded area, defined by the eye pattern standards, that the waveform should not overlap. If a cross point can not be maintained at a location near the 50% point of the amplitude of the signals, the eye pattern will be distorted and the standards will not be satisfied.

As is shown in FIG. 1A, according to LVDS, a signal transmission is delayed by the effect of jitter, and when the fluctuation direction differs for both complementary signals, a cross point P81 is moved to P82, and a cross point P83 is moved to P84. Since the cross points are greatly shifted from locations near the 50% point of the amplitude signals, the adjustment of the cross points is difficult.

The second problem is that, as is shown in FIG. 1B, the inclination of the leading/falling edge of an output signal fluctuates due to the characteristic change that is caused by a primary manufacturing factor. Since the fluctuation of the inclination due to the characteristic change that is caused by the manufacturing factor is large, and the fluctuation direction may differ for both complementary signals, cross points may be generated at various positions, such as P91 to P95, or no cross point may be generated, so that a satisfactory margin relative to the eye pattern standards can not be obtained.

An explanation has been given that a circuit, such as an LVDS circuit, for inputting a complementary signal and outputting a complementary signal is greatly affected by jitter. On the other hand, for a complementary signal generation circuit for receiving one signal and for generating and outputting an in-phase signal and an antiphase signal thereof, when jitter affects an input signal, both the output in-phase signal and the output antiphase signal are moved in the same direction. Thus, although jitter occurs in the complementary signal generation circuit due to the interaction between inverters 15, 16 and 17 and a parasitic element, compared with the LVDS circuit, the jitter will produce only small a effect, which is the factor of the distortion of the eye pattern. FIG. 2 is a circuit diagram showing a first conventional complementary signal generation circuit. An input signal 101 is passed through inverters 15 and 16, and is output as an in-phase signal 103, and is also passed through the inverters 15, 16 and 17, and is output as an antiphase signal 102.

In the complementary signal generation circuit in FIG. 2, the effect produced by the jitter and the distortion of the eye pattern is smaller than that for the LVDS. However, in the complementary signal generation circuit shown in FIG. 2, the number of inverter stages from the input to the in-phase output differs from the number of inverter stages from the input to the anti-phase output, i.e., in the first case it is two and in the second it is three. Thus, the output waveform fluctuates due to the characteristic change caused by the manufacturing factor, and distortion of the eye pattern occurs. In order to locate the cross point near the 50% point of the amplitude, the sum of the delay of the inverter 17 and the delay produced by the inverter 18 must be substantially equal to the delay produced by the inverter 16, so that the inclination of the change of the in-phase signal 103 must be much greater than the inclination of the change of the antiphase signal 102. Accordingly, the change in the inclination of the in-phase signal 103 accompanied by the characteristic variance of the transistor would be increased.

As a second conventional example, there is a complementary signal generation circuit wherein the number of gate stages from the input to the antiphase output is equal to the number of gate stages from the input to the in-phase output. FIGS. 3A and 3B are circuit diagrams showing a complementary signal generation circuit disclosed in Japanese Patent Laid-Open No. 03-258015. As is shown in FIG. 3A, an inverter 81 and a buffer circuit 82 constitute a complementary signal generation circuit, and a signal 101 is input to the inverter 81 and the buffer circuit 82. The inverter 81 inverts the input signal 101, and generates an antiphase signal 102, while the buffer circuit 82 uses the input signal 101 to generate an in-phase signal 103.

As is shown in FIG. 3B, the inverter 81 is so designed that a p channel MOS transistor Qp21 and an n channel MOS transistor Qn21 are connected in series between a power source and the ground, and the buffer circuit 82 is so designed that an n channel MOS transistor Qn22 and a p channel MOS transistor Qp22 are connected in series between a power source and the ground.

In the complementary signal generation circuit in FIGS. 3A and 3B, since the input signal 101 is transmitted along a signal path formed of a single logical stage provided by either the inverter 81 or the buffer circuit 82, theoretically the delays produced along the signal path by these two components are equal, and the start time of the change point is the same for the antiphase signal 102 and the in-phase signal 103.

However, in actuality, since the absolute value of the gain of the inverter 81 is large near the point representing 50% of the amplitude, while the absolute value of the gain of the buffer circuit 82 is small, the response to a change in the input signal 102 differs between the inverter 81 and the buffer circuit 82. Therefore, in the second conventional complementary signal generation circuit, when a transistor characteristic, such as a threshold voltage, is changed due to a manufacturing factor, the delay and the inclination of the waveform vary for each complementary signal, and it is difficult to adjust a cross point so as to satisfy the eye pattern standards.

SUMMARY OF THE INVENTION

To resolve the above described shortcomings of the conventional examples, it is one objective of the present invention to provide a complementary signal generation circuit that can reduce the occurrence of waveform distortion due to jitter, and can also reduce the occurrence of waveform distortion due to the fluctuation of a transistor characteristic that is caused by a manufacturing factor.

To achieve this objective, according to one aspect of the present invention, a complementary signal generation circuit comprises:

a complementary signal generator for generating an antiphase signal from a input signal, input at a signal input terminal, and outputting the antiphase signal from a first internal signal terminal, and for generating an in-phase signal from the input signal and outputting the in-phase signal from a second internal signal terminal;

a flip-flop, including
  a first P channel MOS transistor, the source of which is connected to a first power source,
  a second P channel transistor, the source of which is connected to the first power source,
  a first N channel MOS transistor, the source of which is connected to a second power source and the drain of which is connected to the drain of the first P channel MOS transistor and the gate of the second P channel MOS transistor, and
  a second N channel MOS transistor, the source of which is connected to the second power source and the drain of which is connected to the drain of the second P channel MOS transistor and the gate of the first P channel MOS transistor;

a first RC series circuit including
  a first transfer gate including an N channel MOS transistor, the source of which is connected to a first node, the gate of which is connected to the first power source and the drain of which is connected to a second node, and
  a capacitor connected to the first node;

a second RC series circuit including
  a second transfer gate including an N channel MOS transistor, the source of which is connected to a third node, the gate of which is connected to the first power source and the drain of which is connected to a fourth node, and
  a capacitor connected to the third node;

an in-phase signal output terminal for outputting an in-phase signal to the outside; and an antiphase signal output terminal for outputting an antiphase signal to the outside, wherein the first internal signal terminal is connected to the gate of the first N channel MOS transistor and the second node, the second internal signal terminal is connected to the gate of the second N channel MOS transistor and the fourth node, the drain of the first N channel MOS transistor is connected to the in-phase output terminal, and the drain of the second N channel MOS transistor is connected to the antiphase signal output terminal. This is the basic configuration.

According to another aspect of the present invention, for the complementary signal generation circuit of this basic configuration, the capacitor of the first RC series circuit may be constituted by a P channel MOS transistor, the source and the drain of which are connected to the first power source and the gate of which is connected to the first node, and the capacitor of the second RC series circuit may be constituted by a P channel MOS transistor, the source and the drain of which are connected to the first power source and the gate of which is connected to the third node.

According to an additional aspect of the present invention, for the complementary signal generation circuit of the basic configuration, the first transfer gate of the first RC series circuit may include:
  an N channel MOS transistor, the source of which is connected to the first node, the gate of which is connected to the first power source and the drain of which is connected to the second node; and
  a P channel MOS transistor, the source of which is connected to the first node, the gate of which is connected to the second power source and the drain of which is connected to the second node. The second transfer gate of the second RC series circuit may include:
  an N channel MOS transistor, the source of which is connected to the third node, the gate of which is connected to the first power source and the drain of which is connected to the fourth node; and
  a P channel MOS transistor, the source of which is connected to the third node, the gate of which is connected to the second power source and the drain of which is connected to the fourth node.

According to a further aspect of the invention, the complementary signal generation circuit of the basic configuration may further comprise:

a third RC series circuit including
  a third transfer gate including a P channel MOS transistor, the source of which is connected to a fifth node, the gate of which is connected to the second power source and the drain of which is connected to a sixth node, and
  a capacitor connected to the fifth node, wherein the sixth node is connected to the drain of the second N MOS transistor; and a fourth RC series circuit including
  a fourth transfer gate including a P channel MOS transistor, the source of which is connected to a seventh node, the gate of which is connected to the second power source and the drain of which is connected to an eighth node, and
  a capacitor connected to the seventh node, wherein the eighth node is connected to the drain of the first N channel MOS transistor.

According to a still further aspect of the invention, the complementary signal generation circuit of the basic configuration may further comprise:

a first inverter, the input terminal of which is connected to the drain of the first N channel MOS transistor and the output of which is connected to the antiphase signal output terminal; and a second inverter, the input terminal of which is connected to the drain of the second N channel MOS transistor and the output terminal of which is connected to the in-phase signal output terminal.

According to yet one more aspect of the invention, for the complementary signal generation circuit of the basic configuration, both the source of the first P channel MOS transistor and the source of the second P channel MOS transistor may be connected to a third power source for supplying a higher voltage than the fist power source.

The above objectives and features and other relevant objectives and features will become apparent in due course during the following description given while referring to the accompanying drawings, and innovative matters pointed out in claims.

BRIEF DESCRIPTION OF THE DRAWINGS

FIG. 8 is a diagram showing a comparison, obtained through a SPICE simulation, between the complementary signal generation circuit of the first embodiment and the first conventional example for a delay time up until an in-phase signal is output for an input signal.

DETAILED DESCRIPTION OF THE PREFERRED EMBODIMENTS

The preferred embodiments of the present invention will now be described in detail while referring to the accompanying drawings.

Figure 4:
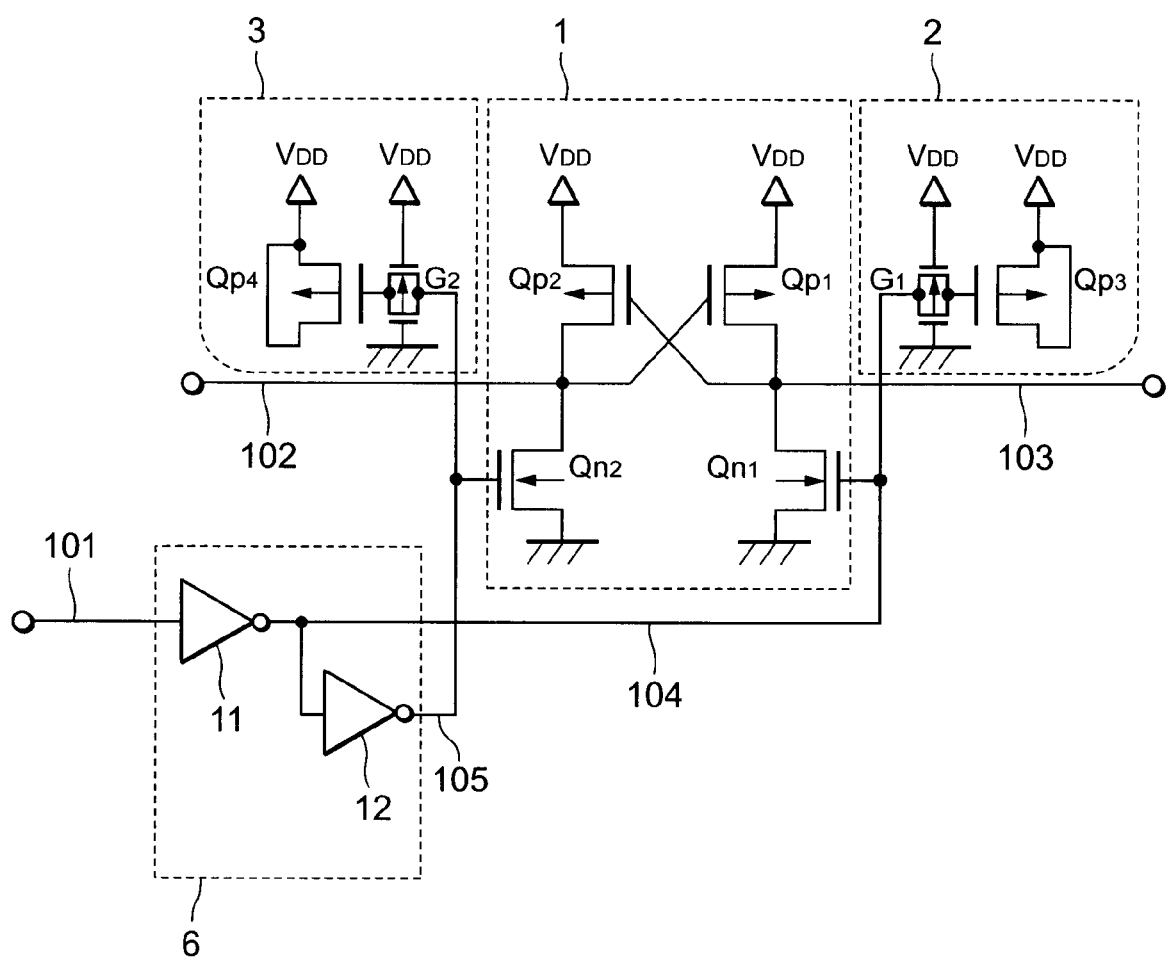
FIG. 4 is a circuit diagram showing a complementary signal generation circuit according to a fist embodiment of the present invention.

FIG. 4 is a circuit diagram showing a complementary signal generation circuit according to the first embodiment of the present invention. The complementary signal generation circuit in this embodiment comprises: a flip-flop 1, a first RC series circuit 2, a second RC series circuit 3, and a complementary signal generator 6. This complementary signal generation circuit receives a signal 101, and outputs externally an antiphase signal 102 and a in-phase signal 103.

The complementary signal generator 6 includes inverters 11 and 12. The inverter 11 receives the input signal 101, and outputs a first internal signal 104 having the phase opposite to that of the input signal 101, and the inverter 12 receives the first internal signal 104 and outputs a second internal signal 105 having the same phase as the input signal 101.

The flip-flop 1 includes: a transistor Qp1, which is a first p channel MOS transistor; a transistor Qp2, which is a second p channel MOS transistor; a transistor Qn1, which is a first n channel MOS transistor; and a transistor Qn2, which is a second n channel MOS transistor.

The first RC series circuit 2 includes: a transistor Qp3, which is a third p channel MOS transistor; and a transfer gate G1, which is a first transfer gate. The second RC series circuit 3 includes a transistor Qp4. which is a p channel MOS transistor; and a transfer gate G2, which is a second transfer gate.

For the transistors Qp3 and Qp4, the capacitance between their gates and the channels is used as a capacitance element, and for the transfer gate G1 and the transfer gate G2, the ON resistance is used as a resistance element.

The source and the drain of the transistor Qp3 are connected to a power source VDD, which is a first power source, to which the source and the drain of the transistor Qp4 are also connected. The transfer gate G1 includes an n channel MOS transistor and a p channel MOS transistor. The sources of these transistors are connected and are also connected in common to the gate of the transistor Qp3, the drains thereof are connected and are also connected in common to the gate of the transistor Qn1 in the flip-flop 1. The gate of the n channel MOS transistor is connected to the power source VDD, and the gate of the p channel MOS transistor is connected to a ground level that is a second power source. The transfer gate G2 includes an n channel MOS transistor and a p channel MOS transistor, the sources of which are connected and are also connected in common to the gate of the transistor Qp4, and the drains of which are connected and are also connected in common to the gate of the transistor Qn2 in the flip-flop 1. The gate of the n channel MOS transistor is connected to the power source VDD, and the gate of the p channel MOS transistor is grounded.

That is, the gate of the transistor Qp4 is connected via the transfer gate G2 to the gate of the transistor Qn2 and the output terminal of the inverter 12, and the gate of the transistor Qp3 is connected via the transfer gate G1 to the gate of the transistor Qn1, the output terminal of the inverter 11 and the input terminal of the inverter 12.

The source of the transistor Qp1 and the source of the transistor Qp2 are connected to the power source VDD, while the gate of the transistor Qp1 is connected to the drains of the transistors Qp2 and Qn2 and the gate of the transistor Qp2 is connected to the drains of the transistors Qp1 and Qn1. The sources of both the transistor Qn1 and the transistor Qn2 are grounded.

Figure 5:
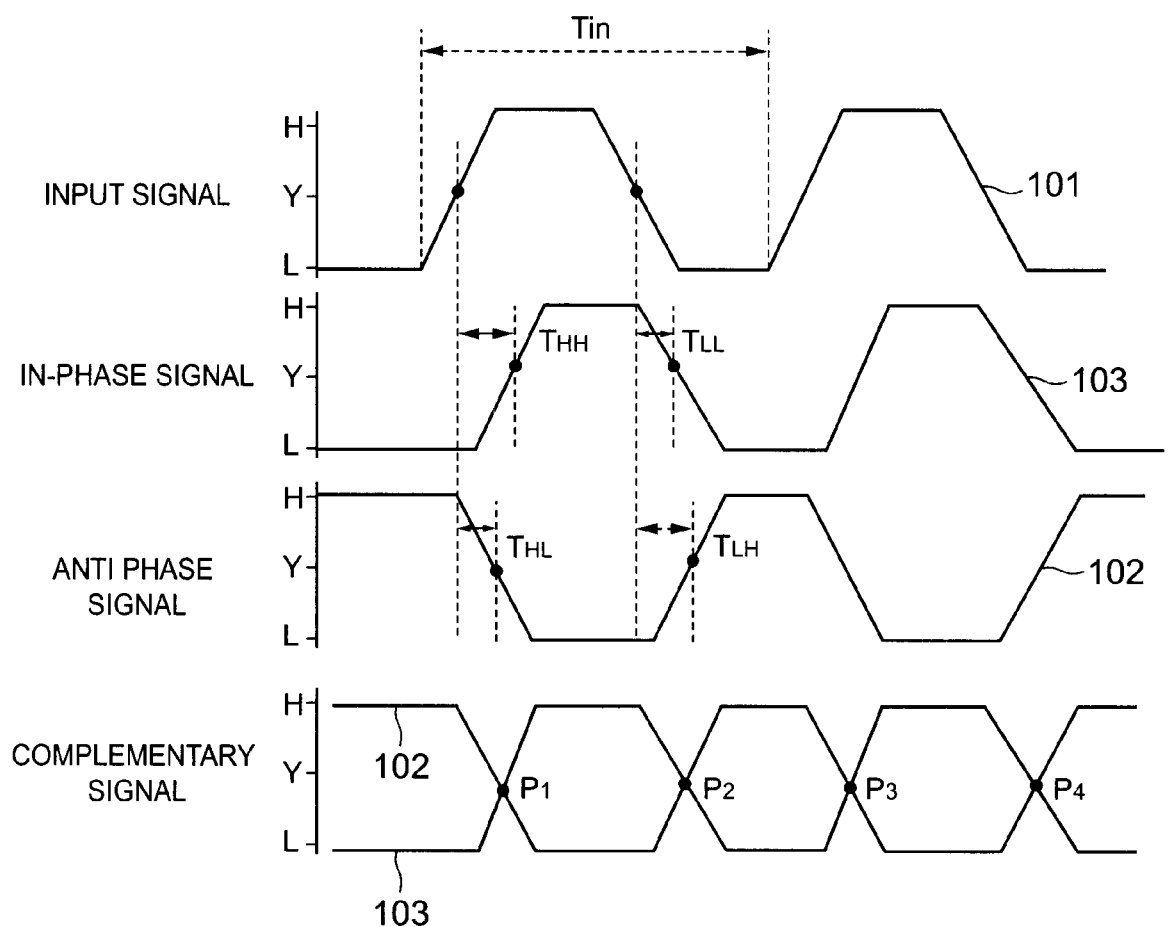
FIG. 5 is a timing chart showing the operation of the complementary signal generation circuit according to the embodiment.

FIG. 5 is a timing chart showing the operation of the complementary signal generation circuit in FIG. 4. In FIG. 5, "H" along the vertical axis represents a high level, "Y" indicates an intermediate level, and "L" indicates a low level. The intermediate level (Y level) is the level at 50% of the amplitude calculated from the low level (L) and the high level (H level). The input signal 101 is a signal whereby a change in the level H or the level L is repeated at cycle Tin, and is transmitted to the input terminal of the inverter 11.

The inverter 11 inverts the input signal 101 and outputs a first internal signal 104 to the gate of the transistor Qn1, which is one of the input terminals for the flip-flop 1, to the input terminal of the inverter 12 and to the transfer gate G1 of the first RC series circuit 2.

The inverter 12 generates a second internal signal 105 by inverting the first internal signal 104, and transmits the second internal signal 105 to the gate of the transistor Qn2, which is the other input terminal of the flip-flop 1, and to the transfer gate G2 of the second RC series circuit 3. The second internal signal 105 is delayed more than the first internal signal 104 by a time equivalent to the length of the distance required for the transmission via the inverter 12.

The flip-flop 1 has two holding states in which either the transistor Qp1 or the transistor Qp2 is maintained ON. The determination of the holding state is dependent on which of the internal signals, the first internal signal 104 or the second internal signal 105, goes to level H. The first internal signal 104 and the second internal signal 105 alternately go to level H at the cycle Tin.

Based on the holding state that is determined, the flip-flop outputs the in-phase signal 103 from the drain of the transistor Qn1, which is one of the output terminals, and outputs the antiphase signal 102 from the drain of the transistor Qn2, which is the other output terminal.

When the first internal signal 104 goes to level H, the gate potential of the transistor Qn1 rises and the in-phase signal 103 falls to level L. Further, the gate potential of the transistor Qp2 is dropped and the antiphase signal 102 goes to level H.

When the second internal signal 105 goes to level H, the gate potential of the transistor Qn2 rises and the antiphase signal 102 goes to level L. Furthermore, the gate potential of the transistor Qp1 drops and the in-phase signal 103 goes to level L.

The first RC series circuit 2 is equivalent to a circuit wherein a resistor and a capacitor are connected in series. The transfer gate G1 is always in the ON state, and this ON-resistance of the transfer gate G1 serves as the resistance element of the series circuit, while the capacitance between the gate and the channel of the transistor Qp3 serves as the capacitance of the series circuit.

The first RC series circuit 2 is connected between the gate of the transistor Qn1 and the power source VDD, and acts as an effective load on the inverter 11. Similarly, the second RC series circuit 3 acts as an effective load on the inverter 12.

Cross point adjustment will now be described. The level change of the input signal 101 is transmitted as a level inversion operation performed by the logical elements along the signal path, and the levels of the antiphase signal 102 and the in-phase signal 103 are changed. The logical elements along the signal path indicate the inverters 11 and 12 and the transistors Qn1, Qn2, Qp1 and Qp2. For the antiphase signal 102 and the in-phase signal 103, the number of logical stages, which represents the number of level inversion operations performed by the logical elements, is different.

When the input signal 101 goes to level L, the rise of the input signal 101 is transmitted along the signal path L1 which is formed of three logical stages constituted by the inverters 11 and 12 and the transistor Qn2, and the antiphase signal 102 falls.

At the fall timing of the antiphase signal 102, the in-phase signal 103 rises through the level inversion operation performed by the transistor Qp1. The input signal 101 is transmitted along the signal path L2 consisting of four logical stages for which the level inversion operation of the transistor Qp1 is added to the signal path L1. Since the number of logical stages along the signal path L2 is greater by one than that for the signal path L1, the rise start time of the in-phase signal 103 is delayed from the fall start time of the antiphase signal 102.

The transistor Qp1 is so designed that the ON resistance is smaller than that for the transistor Qn2, and the inclination of the waveform is greater for the rise of the in-phase signal 103 than for the fall of the antiphase signal 102.

A delay time THL, from the time whereat the input signal 101 rises and goes to level Y to the time whereat the antiphase signal 102 falls and goes to level Y, and a delay time THH, the period before the in-phase signal 103 rises and goes to level Y, are measured by using a circuit simulation. Based on the measurement results, the transistors Qp1 and Qn2 are designed so that the timings for them correspond to the delay times THL and THH. Thus, the antiphase signal 102 and the in-phase signal 103 go to level Y at the same time and pass through the cross points p1 and p3.

When the input signal 101 is changed to level L, the fall of the input signal 101 is transmitted along a signal path L3 formed of two logical stages constituted by the inverter 11 and the transistor Qn1, and the in-phase signal 103 falls.

At the fall timing of the in-phase signal 103, the antiphase signal 102 rises as a result of the level inversion operation performed by the transistor Qp2. The input signal 101 is transmitted along a signal path L4 consisting of three logical stages that is formed by adding the level inversion operation of the transistor Qp2 to the signal path L3. Since the number of stages along the signal path L4 is greater by one than that along the signal path L3, for the antiphase signal 102 the rise start time is delayed more than is the fall start time for the in-phase signal 103.

Since the transistor Qp2 is so designed that the ON resistance is smaller than that of the transistor Qn1, the inclination of the waveform when the antiphase signal 102 rises is greater than that when the in-phase signal 103 falls.

A TLH delay time, from the time whereat the input signal 101 falls and goes to level L to the time whereat the antiphase signal 102 rises and goes to level Y, and a delay time TLL, the period before the in-phase signal 103 falls and goes to level Y, are measured by using a circuit simulation. Based on the measurement results, the transistors Qp2 and Qn1 are designed so that the time for them correspond to the delay times TLH and TLL. Thus, the antiphase signal 102 and the in-phase signal 103 go to level Y at the same time and pass through the cross points p2 and p4.

Figure 6:
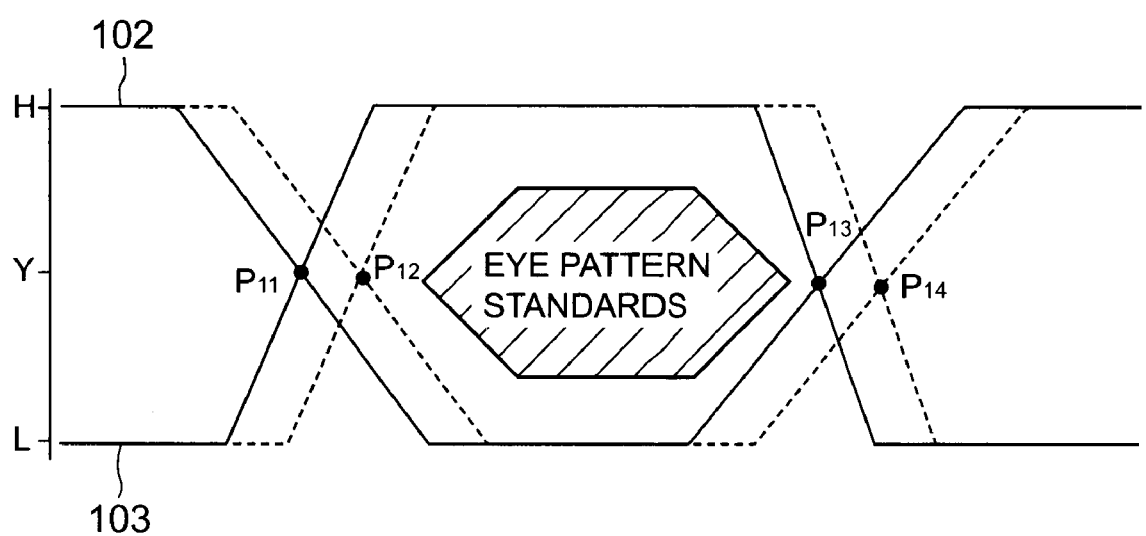
FIG. 6 is a diagram showing the function of the complementary signal generation circuit according to the first embodiment for maintaining a cross point relative to jitter.

FIG. 6 is a diagram showing the function of the complementary signal generation circuit in FIG. 4 for maintaining a cross point relative to jitter. The solid lines indicate the original antiphase signal 102 and the original in-phase signal 103, and P11 and P13 denote the original cross points that are not affected by a jitter. When the antiphase signal 102 and the in-phase signal 103 are delayed due to jitter, as is indicated by broken lines, the jitter moves the cross points to P12 and P14.

Jitter occurring in the circuit is a phenomenon whereby, when multiple signal paths differ, an irregular fluctuation is generated during the signal delay period by an effect produced by a parasitic element.

When the rise of the input signal 101 is delayed by jitter, the antiphase signal 102 is delayed along the signal path L1, and the in-phase signal 103 is delayed along the signal path L2. Since almost all of the signal path L2 is common to the signal path L1, the delay time for the antiphase signal 102 is substantially equal to the delay time for the in-phase signal 103.

As is shown in FIG. 6, the delay times THL and THH are increased in the same manner. Since the increase in the delay between the fall of the antiphase signal 102 and the rise of the in-phase signal 103 is substantially equal, the two signals are shifted from the solid lines to the broken lines, in parallel to the time axis. And since the cross point P11 is shifted to the cross point P12, in parallel to the time axis, the cross point P12 as well as the cross point P11 is maintained at level Y.

When the fall of the input signal 101 is delayed by jitter, the in-phase signal 103 is delayed along the signal path L3, and the antiphase signal 102 is delayed along the signal path L4. Since almost the entire signal path L4 is common to the signal path L3, the delay time for the in-phase signal 103 is substantially equal to the delay time for the antiphase signal 102.

As is shown in FIG. 6, the delay times TLL and TLH are increased in the same manner. Since the increase in the delay is substantially equal between the fall of the in-phase signal 103 and the rise of the antiphase signal 102, the two signals are shifted from the solid lines to the broken lines, in parallel to the time axis. And since the cross point P13 is moved to the cross point P14, in parallel to the time axis, the cross point P14 as well as the cross point P13 is maintained at level Y.

Figure 7:
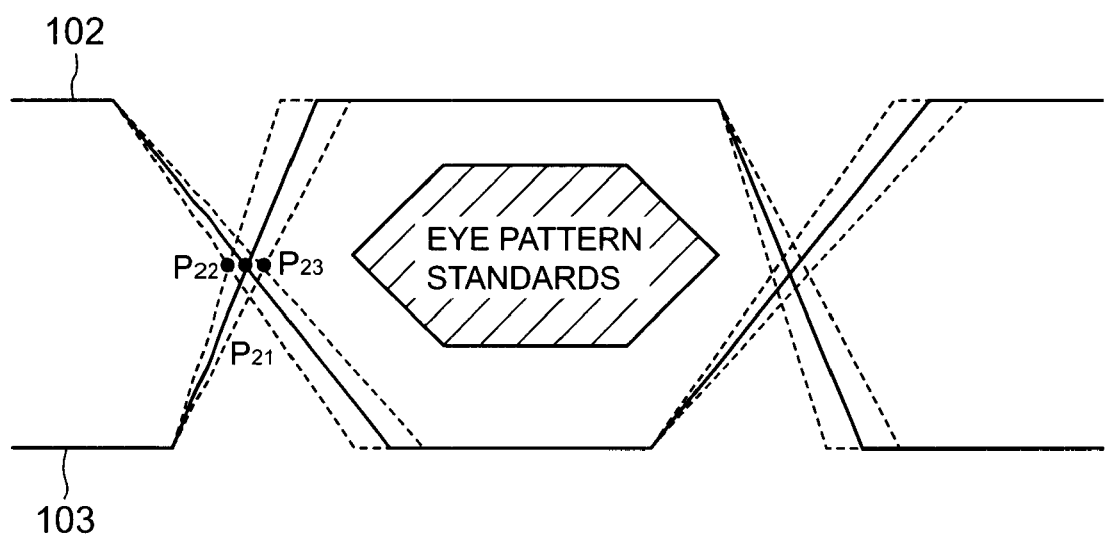
FIG. 7 is a diagram showing the function of the complementary signal generation circuit according to the first embodiment for maintaining a cross point relative to a manufacturing factor.

FIG. 7 is a diagram showing the function of the complementary signal generation circuit in FIG. 4 for maintaining the cross point relative to a characteristic change occurring due to a manufacturing factor. The ON resistance of the n channel MOS transistor is changed by the characteristic change due to the manufacturing factor, e.g., depending on whether a longer or shorter channel is prepared for the MOS transistor, whether a higher or lower threshold value is obtained, and whether a gate insulating film is formed thicker or thinner. Then, the inclination of the complementary signal is changed.

The cross point P21 at the intersection of the antiphase signal 102 and the in-phase signal 103, which are indicated by solid lines, represents the time whereat no affect is produced by the manufacturing factor. The cross points P22 and P23 at the antiphase signal 102 and the in-phase signal 103, which are represented by broken lines, indicate a case wherein an affect is produced by the manufacturing factor. For the rise of the input signal 101, the inclination of the falling antiphase signal 102 and the rise of the in-phase signal 103 are changed due to the manufacturing factor.

When the ON resistance of the n channel MOS transistor is reduced due to the manufacturing factor, e.g., when the threshold voltage of the n channel MOS transistor is reduced and is lower than usual, the ON resistance of the transistor Qn2 is reduced and the driving capability is increased, so that the inclination of the fall of the antiphase signal 102 is increased. At this time, the threshold voltage of the n channel MOS transistor of the transfer gate G2 is also reduced, so that the ON resistance of the transfer gate G2 is reduced. As a result, the resistance of the second RC series circuit 3 is reduced, and acts as an increase in the effective load on the inverter 12. Therefore, since the increase in the potential at the gate of the transistor Qn2 is moderated, the driving capability is reduced and the increase in the inclination of the fall of the antiphase signal 102 is suppressed. That is, while the inclinations of both the in-phase signal 103 and the antiphase signal 102 are being increased, the second RC series circuit 3 suppresses this increase so that the cross point P21 is moved to the cross point P22, almost in parallel to the time axis, and level Y is maintained.

Further, when the ON resistance of the n channel MOS transistor is increased due to the effect of a manufacturing factor, e.g., when the threshold voltage of the n channel MOS transistor is set higher than normal, the ON resistance of the transistor Qn2 is increased and the driving capability is reduced, so that the inclination of the fall of the antiphase signal 102 is reduced. At this time, since the threshold voltage of the n channel MOS transistor of the transfer gate G2 is also increased, the ON resistance of the transfer gate G2 is increased. As a result, the ON resistance of the second RC series circuit 3 is increased and this reduces the effective load on the inverter 12. Accordingly, since the potential at the gate of the transistor Qn2 rises sharply, the driving capability is increased and the reduction in the inclination of the fall of the antiphase signal 102 is suppressed. And since the in-phase signal 103 starts to rise as the antiphase signal 102 falls, the reduction in the inclination of the in-phase signal 103 is suppressed. That is, while the inclinations of both the in-phase signal 103 and the antiphase signal 102 are reduced, the reduction in the inclination of the second RC series circuit 3 is suppressed. Thus, the cross point P21 is moved to the cross point P23, almost in parallel to the time axis, and level Y is maintained.

At fall timing of input signal 101, the inclinations of the fall of the in-phase signal 103 and the rise of the antiphase signal 102 are changed due to the manufacturing factor. The first RC series circuit 2 as well as the second series circuit 3 acts as an effective load on the inverter 11 relative to the affect of the manufacturing factor. And in the same manner, the change in the inclinations of the in-phase signal 103 and the antiphase signal 102 are suppressed and the cross point is maintained at level Y.

The transfer gates G1 and G2 each include an n channel and a p channel MOS transistor. And as can be easily estimated from the above explanation, the p channel MOS transistor may be deleted from the transfer gate G1 in FIG. 4, and the transfer gate G1 may be constituted only by an n channel MOS transistor, the gate of which is connected to the power source VDD. Similarly, the p channel MOS transistor may be deleted from the transfer gate G2 in FIG. 4, and the transfer gate G2 may be constituted only by an n channel MOS transistor, the gate of which is connected to the power source VDD.

Figure 1A:
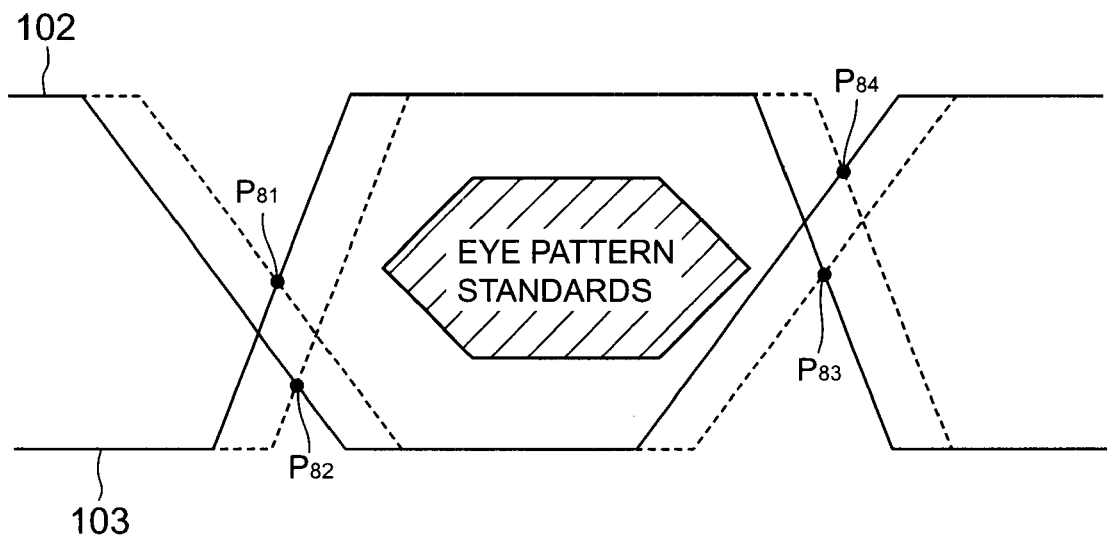
FIG. 1A is a diagram showing distortion of an eye pattern due to jitter.
Figure 1B:
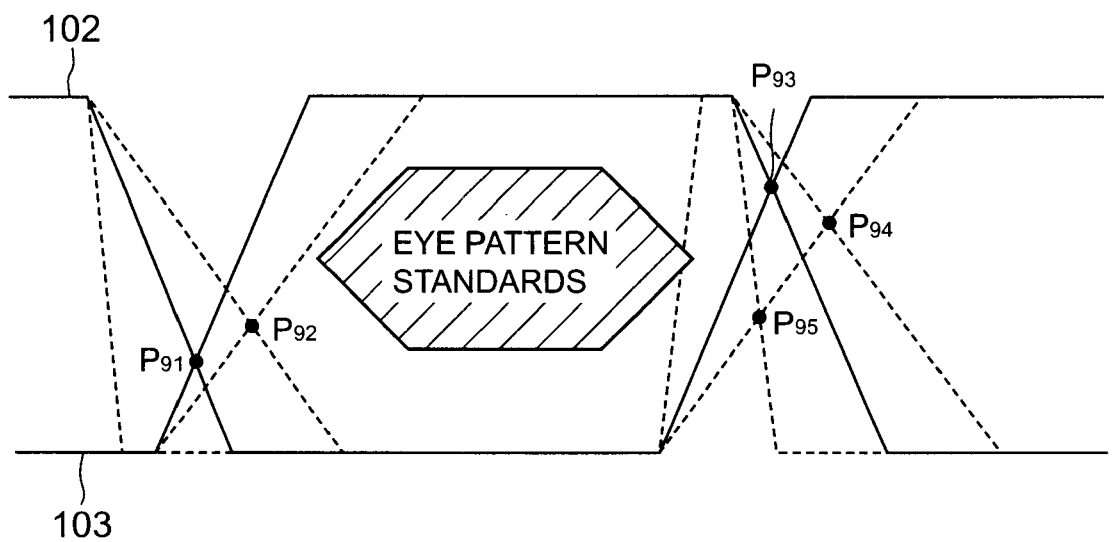
FIG. 1B is a diagram showing distortion of an eye pattern due to a manufacturing factor.
Figure 2:
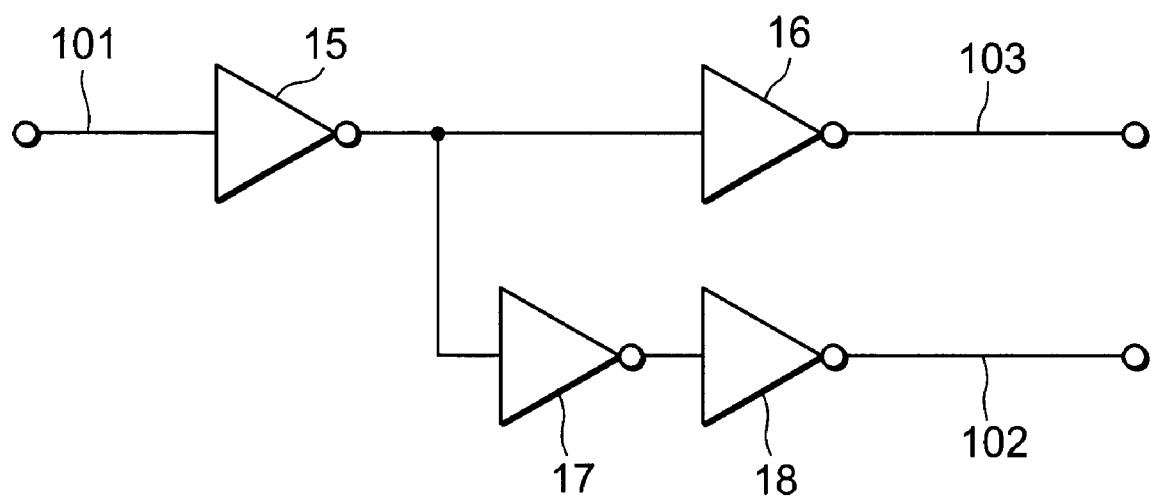
FIG. 2 is a circuit diagram showing a first conventional complementary signal generation circuit.
Figure 3A:
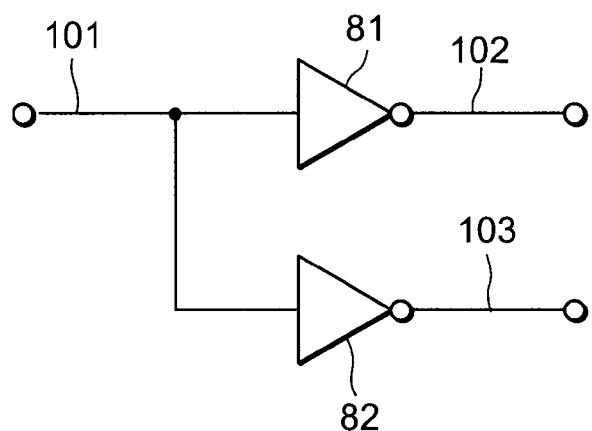
FIG. 3A is a circuit diagram showing the logical gate level of a second conventional complementary signal generation circuit.
Figure 3B:
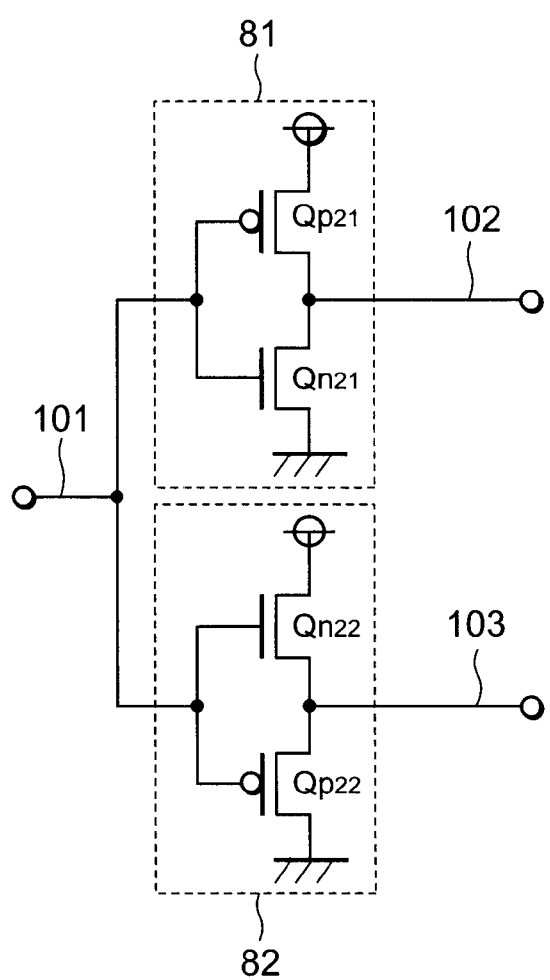
FIG. 3B is a circuit diagram showing the transistor level of the second conventional complementary signal generation circuit.

FIG. 8 is a diagram showing the results obtained when a simulation was performed using a circuit simulator SPICE for the first conventional example in FIG. 2 and the complementary signal generation circuit in FIG. 4. The delay times THH and TLL for the in-phase signal 103 were measured.

The circuit in FIG. 4 is operated, as is normal, under the design condition wherein the channel length, the threshold voltage and the thickness of the gate insulating film are standard values, and under an operating condition wherein the power voltage is 1.8 V and the temperature is 25° C. The SLOW condition and the FAST condition are assumed as conditions for the affect produced by a manufacturing factor.

Under the SLOW condition, the simulation was performed by using a characteristic parameter obtained when the channel length was greater than the standard value, the absolute value of the threshold voltage was high and the thick gate insulating film was formed, and by setting a power voltage of 1.65 V and a temperature of 125° C. Further, under the FAST condition, the simulation was performed by using a characteristic parameter obtained when the channel length was shorter than the standard value, the absolute value of the threshold voltage was low and the thin gate insulating film was formed, and by setting a power voltage of 1.95 V and a temperature of −40° C.

The variance value is a difference between the results obtained under the SLOW condition and the results obtained under the FAST condition. When the circuit in FIG. 4 is compared with the circuit in FIG. 2, the delay time THH is reduced from 0.713 to 0.0666, and the delay time TLL is reduced form 0.0943 to 0.0768, so that the cross point maintenance function is effectively performed.

According to the embodiment, almost all the portions of the signal paths for the in-phase signal 103 and the antiphase signal 102 are formed by using the same paths of the complementary signal generator 6 and the flip-flop 1. Therefore, since the changes in the delays due to jitter occur in the same direction, the effect of the jitter on the cross point change can be suppressed and the cross point can be maintained so it is near 50% of the amplitude.

Further, according to the embodiment, since the ON resistances of the transistors Qn1 and Qn2 are changed, the RC series circuits act to suppress the fluctuations in the driving capacities of the transistors Qn1 and Qn2. Thus, the affect of the manufacturing factor on the shifting of the cross point can be suppressed, and the cross point can be maintained near 50% of the amplitude.

Figure 9:
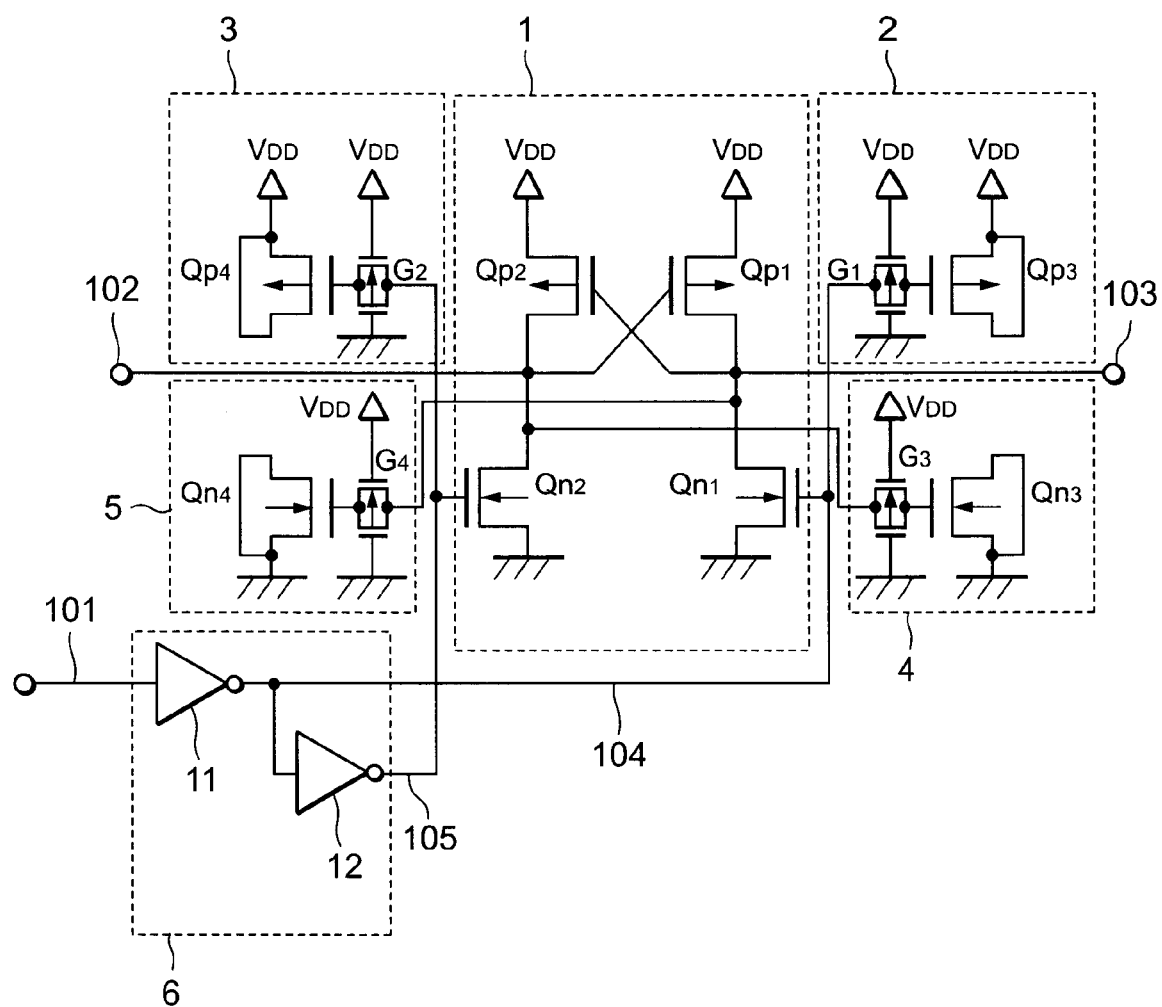
FIG. 9 is a circuit diagram showing a complementary signal generation circuit according to a second embodiment of the present invention that differs from the first embodiment in that RC series circuits 4 and 5 are further included.

FIG. 9 is a circuit diagram showing a complementary signal generation circuit according to a second embodiment of the present invention. In this embodiment, RC series circuits 4 and 5 are added to the circuit in FIG. 4 for the first embodiment, so that the cross point maintenance function is performed even when the ON resistance of the p channel MOS transistor is changed due to the affect of a manufacturing factor.

The RC series circuit 4 includes an n channel MOS transistor Qn3 and a transfer gate G3, and the RC series circuit 5 includes an n channel MOS transistor Qn4 and a transfer gate G4.

For the transistors Qn3 and Qn4, the capacitance between the gate and the channel serves as the capacitance element, and for the transfer gates G3 and G4, the ON resistance serves as the resistance element.

The source and the drain of the transistor Qn3 are grounded, as are the source and the drain of the transistor Qn4. The transfer gate G3 includes paired n channel and p channel MOS transistors. The sources of these transistors are connected and are also connected in common to the gate of the transistor Qn3, the drains are connected and are also connected in common to the drain of the transistor Qn2 in the flip-flop 1, and the gate of the p channel MOS transistor is grounded. And the transfer gate G4 includes paired n channel and p channel MOS transistors. The sources of these transistors are connected and are also connected in common to the gate of the transistor Qn4, the drains are connected and are also connected in common to the drain of the transistor Qn1 in the flip-flop 1. The gate of the n MOS transistor is connected to the power source VDD, and the gate of the p channel MOS transistor is grounded.

That is, the gate of the transistor Qn4 is connected via the transfer gate G4 to the drain of the transistor Qp1, and the gate of the transistor Qn3 is connected via the transfer gate G3 to the drain of the transistor Qp2.

When the ON resistance of the p channel MOS transistor is reduced by the effect produced by the manufacturing factor, e.g., when a small absolute value for the threshold voltage of the p channel MOS transistor is obtained during the manufacturing process, the driving capacities of the transistors Qp1 and Qp2 are increased, so that the potential of the drain is sharply increased.

In this case, the ON resistance of the p channel MOS transistor of the transfer gate G3 is reduced, the RC series circuit 4 acts to increase the effective load on the transistor Qp2, and the potential rise of the drain of the transistor Qp2 is moderated.

Further, when the ON resistance of the p channel MOS transistor is increased by the effect produced by the manufacturing factor, e.g., when absolute value for the threshold voltage of the p channel MOS transistor is higher than usual, the driving capacities of the transistors Qp1 and Qp2 are reduced, so that the inclination of the rise is reduced.

In this case, the ON resistance of the p channel MOS transistor of the transfer gate G4 is increased and the RC series circuit 5 acts to reduce the effective load on the transistor Qp1, and the potential of the drain of the transistor Qp1 tends to be sharply increased.

As is described above, as well as the RC series circuits 2 and 3 that act as effective loads to reduce the change in the inclination of a signal that is caused by a manufacturing factor of the n channel MOS transistor, the RC series circuits 4 and 5 also act as effective loads to reduce the change in the inclination of the signal that is caused by a manufacturing factor of the p channel MOS transistor.

According to the second embodiment, even when the ON resistances of the transistors Qp1 and Qp2 are changed due to a manufacturing factor, the changes in the inclinations of the in-phase signal 103 and the antiphase signal 102 can be suppressed. Therefore, the cross point can more effectively be maintained at level Y than in the first embodiment in FIG. 4.

The transfer gates G3 and G4 have been constituted by an n channel MOS transistor and a p channel MOS transistor. However, as can be easily assumed from the above explanation, the n channel MOS transistor may be deleted form the transfer gate G3 in FIG. 9, and the transfer gate G3 may be constituted only by the p channel MOS transistor, the gate of which is grounded. Similarly, the n channel MOS transistor may be deleted from the transfer gate G4 in FIG. 9, and the transfer gate G4 may be constituted only by the p channel MOS transistor, the gate of which is grounded.

Figure 10:
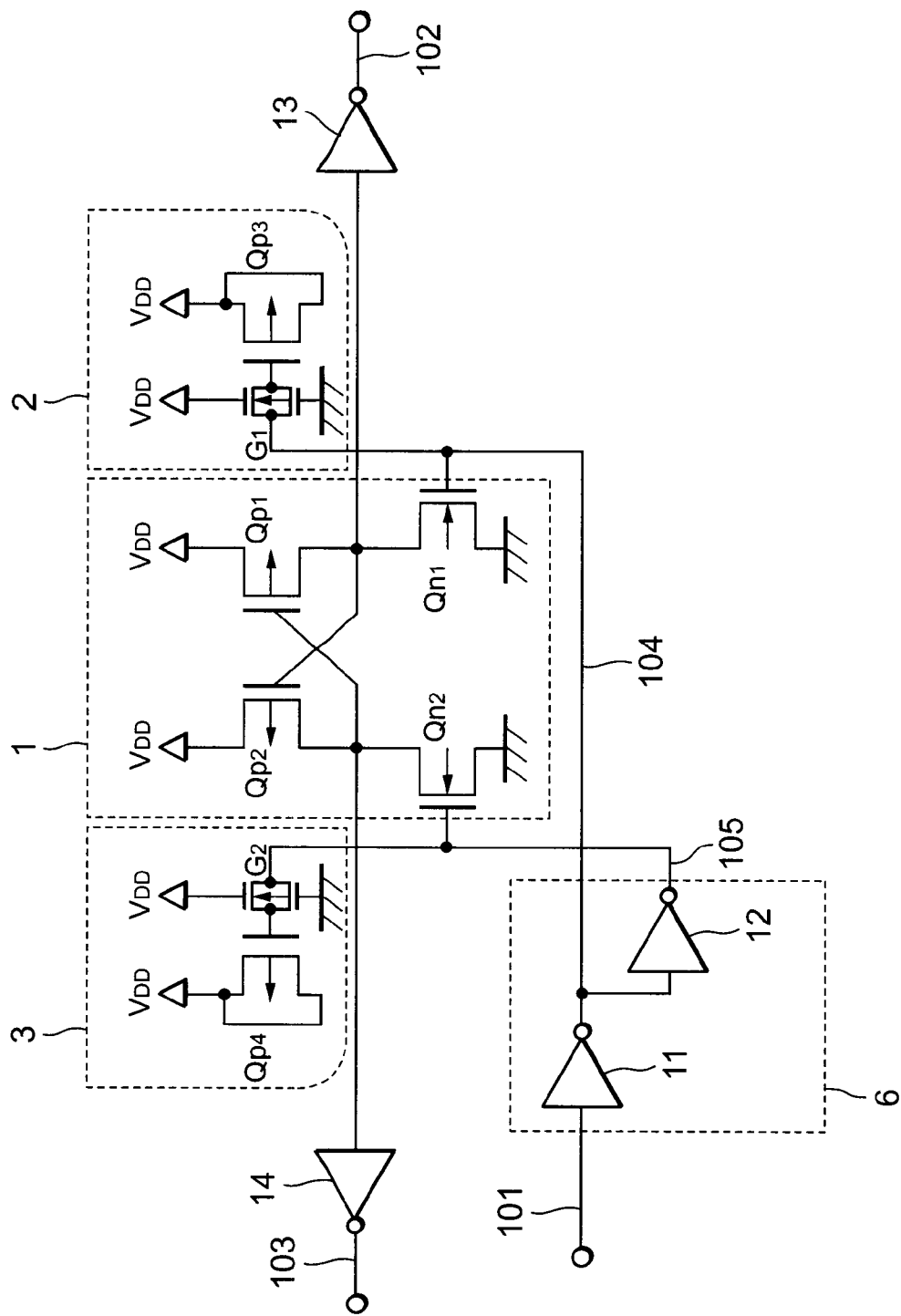
FIG. 10 is a circuit diagram showing a complementary signal generation circuit according to a third embodiment of the present invention that differs from the first embodiment in that an input signal 101 is shaped by an inverter 14 and an in-phase signal 103 is output, and the input signal 101 is shaped by an inverter 13 and an antiphase signal 102 is output.

FIG. 10 is a circuit diagram showing a complementary signal generation circuit according to a third embodiment of the present invention. In this embodiment, the complementary signal generation circuit is the same as in the first embodiment in FIG. 4, except that an inverter 13, which is a first inverter, and an inverter 14, which is a second inverter, are included. Therefore, the complementary signal generation circuit in this embodiment, as well as that in FIG. 4, includes a function for maintaining a cross point by countering the effects of jitter and of a manufacturing factor.

The input terminal of the inverter 13 is connected to the drain of the transistor Qn1, and the antiphase signal 102 is output. While the input terminal of the inverter 14 is connected to the drain of the transistor Qn2, and the in-phase signal 103 is output.

The inverters 13 and 14 are constituted by CMOS circuits, and the ratio of the ON resistances of the n channel MOS transistor and the p channel MOS transistor is adjusted, so that the cross point of the antiphase signal 102 and the in-phase signal 103 is almost at 50% of the signal amplitude.

In this embodiment, the cross point of the antiphase signal 102 and the in-phase signal 103 can be adjusted by the inverters 13 and 14 so it is at 50% of the signal amplitude. Therefore, strict adjustment of the cross point is not required for the design of the flip-flop, and the design process can be simplified.

Figure 11A:
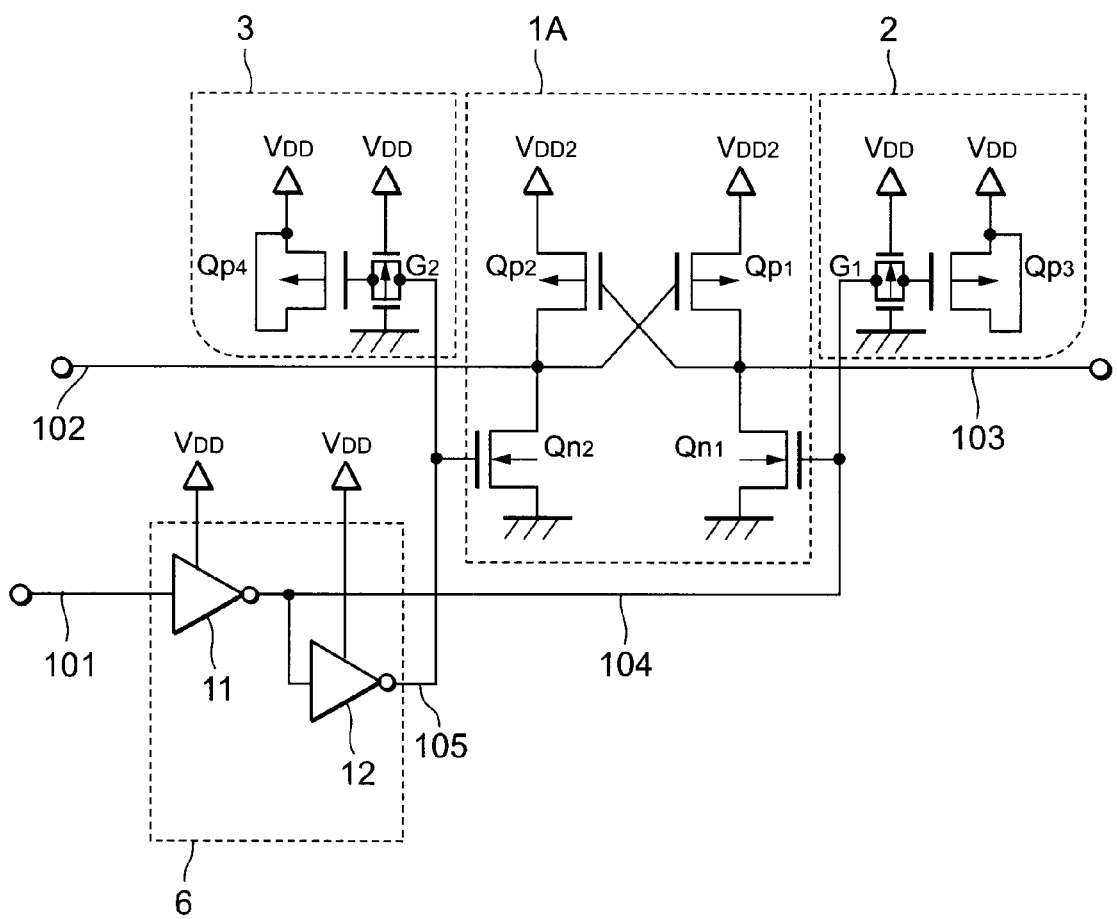
FIG. 11A is a circuit diagram showing a complementary signal generation circuit according to a fourth embodiment of the present invention.

FIG. 11A is a circuit diagram showing a complementary signal generation circuit according to a fourth embodiment of the present invention. In this embodiment, the complementary signal generation circuit has a level shift function for receiving an input signal 101 having the voltage amplitude for a power source VDD, and for outputting an in-phase signal 103 and an antiphase signal 102 having the voltage amplitude of a power source VDD2, which is a third power source provided to supply a voltage higher than that supplied by the power source VDD. Further, the complementary signal generation circuit in this embodiment includes a flip-flop 1A instead of the flip-flop 1 in FIG. 4.

As is shown in FIG. 11A, a voltage higher than that supplied by the power source VDD is applied to the flip-flop 1A, and the sources of transistors Qp1 and Qp2 are connected to the power source VDD2.

Figure 11B:
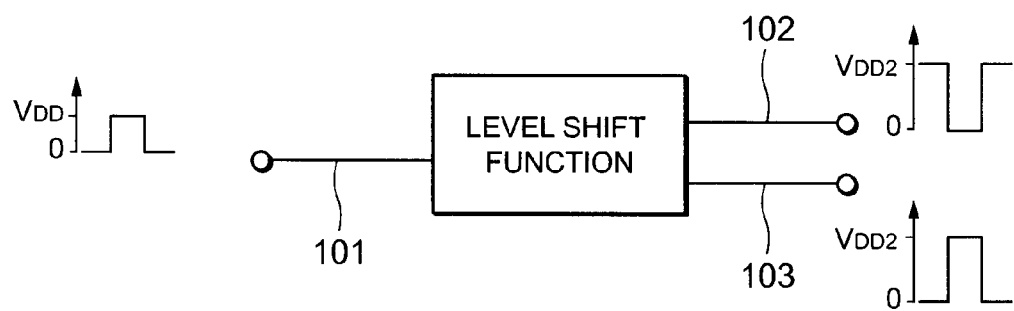
FIG. 11B is a diagram showing the level shift function of the complementary signal generation circuit according to the fourth embodiment for receiving a signal having an amplitude VDD and for outputting an in-phase signal and an antiphase signal having an amplitude VDD2.

As is shown in FIG. 11B, the complementary signal generation circuit in this embodiment receives the input signal 101 of the voltage amplitude of the power source VDD, and employs the level shift function to output the antiphase signal 102 and the in-phase signal 103 of the voltage amplitude of the power source VDD2.

In this embodiment, since the level shift function is performed, a signal can be transmitted between circuits that are operated at different power voltages.

The present invention has been explained based on the preferred embodiments. However, the complementary signal generation circuit in this embodiment is not limited to these embodiments, and the present invention includes various alterations and modifications of the configurations of the embodiments.

As is described above, when the present invention is applied, almost all the portions of the signal paths for the in-phase signal and the antiphase signal can be formed by using the same complementary signal generator and flip-flop paths. Since delays due to jitter are changed in the same direction, the affect of the jitter on the fluctuation of a cross point can be suppressed, and the cross point can be maintained at near 50% of the amplitude. Further, according to the present invention, when the ON resistance of a transistor is changed, the RC series circuit acts to suppress a change in the driving capabilities of the transistors that constitute the flip-flop. Therefore, the affect of a manufacturing factor on the change of a cross point can be suppressed, and the cross point can be maintained at near 50% of the amplitude. Since the complementary signal generation circuit in this invention has a cross point maintenance function, eye pattern standards can be satisfied even when a jitter or a manufacturing factor effect is present.

What is claimed is:

1. A complementary signal generation circuit comprising:
   a complementary signal generator for generating an antiphase signal from an input signal, input at a signal input terminal, and outputting said antiphase signal from a first internal signal terminal, and for generating an in-phase signal from said input signal and outputting said in-phase signal from a second internal signal terminal;
   a flip-flop, including
      a first, first-conductive field-effect transistor, the source of which is connected to a first power source,
      a second, first-conductive field-effect transistor, the source of which is connected to said first power source,
      a first, second-conductive field-effect transistor, the source of which is connected to a second power source and the drain of which is connected to the drain of said first, first-conductive field-effect transistor and the gate of said second, first-conductive field-effect transistor, and
      a second, second-conductive field-effect transistor, the source of which is connected to said second power source and the drain of which is connected to the drain of said second, first-conductive field-effect transistor and the gate of said first, first-conductive field-effect transistor;
   a first RC series circuit including
      a first transfer gate including a second-conductive field-effect transistor, the source of which is connected to a first node, the gate of which is connected to said first power source and the drain of which is connected to a second node, and
      a capacitor connected to said first node;
   a second RC series circuit including
      a second transfer gate including a second-conductive field-effect transistor, the source of which is connected to a third node, the gate of which is connected to said first power source and the drain of which is connected to a fourth node, and
      a capacitor connected to said third node;
   an in-phase signal output terminal for outputting an in-phase signal to the outside; and
   an antiphase signal output terminal for outputting an antiphase signal to the outside,
   wherein said first internal signal is connected to the gate of said first, second-conductive field-effect transistor and said second node, said second internal signal terminal is connected to the gate of said second, second-conductive field-effect transistor and said fourth node, the drain of said first, second-conductive field-effect transistor is connected to said in-phase output terminal, and the drain of said second, second-conductive field-effect transistor is connected to said antiphase signal output terminal.

2. A complementary signal generation circuit according to claim 1, wherein said first-conductive field-effect transistors are p channel MOS transistors and said second-conductive field-effect transistors are n channel MOS transistors.

3. A complementary signal generation circuit according to claim 1, wherein said capacitor of said first RC series circuit is constituted by a first-conductive field-effect transistor, the source and the drain of which are connected to said first power source and the gate of which is connected to said first node; and wherein said capacitor of said second RC series circuit is constituted by a first-conductive field-effect transistor, the source and the drain of which are connected to said first power source and the gate of which is connected to said third node.

4. A complementary signal generation circuit according to claim 1, wherein said first transfer gate of said first RC series circuit further includes a first-conductive field-effect transistor, the source of which is connected to said first node, the gate of which is connected to said second power source and the drain of which is connected to said second node;

and wherein said second transfer gate of said second RC series circuit further includes a first-conductive field-effect transistor, the source of which is connected to said third node, the gate of which is connected to said second power source and the drain of which is connected to said fourth node.

5. A complementary signal generation circuit according to claim 1, further comprising:

a third RC series circuit including
a third transfer gate including a first-conductive field-effect transistor, the source of which is connected to a fifth node, the gate of which is connected to said second power source and the drain of which is connected to a sixth node, and
a capacitor connected to said fifth node, wherein said sixth node is connected to the drain of said second, second-conductive field-effect transistor; and a fourth RC series circuit including
a fourth transfer gate including a first-conductive field-effect transistor, the source of which is connected to a seventh node, the gate of which is connected to said second power source and the drain of which is connected to an eighth node, and
a capacitor connected to said seventh node, wherein said eighth node is connected to the drain of said first, second-conductive field-effect transistor.

6. A complementary signal generation circuit according to claim 1, further comprising:

a third RC series circuit including
a third transfer gate including a first-conductive field-effect transistor, the source of which is connected to a fifth node, the gate of which is connected to said second power source and the drain of which is connected to a sixth node, and
a capacitor constituted by a second-conductive field-effect transistor, the gate of which is connected to said fifth node and the source and the drain of which are connected to said second power source, wherein said sixth node is connected to the drain of said second, second-conductive field-effect transistor; and a fourth RC series circuit including
a fourth transfer gate including a first-conductive field-effect transistor, the source of which is connected to a seventh node, the gate of which is connected to said second power source and the drain of which is connected to an eighth node, and
a capacitor constituted by a second-conductive field-effect transistor, the gate of which is connected to said seventh node and the source and the drain of which are connected to said second power source, wherein said eighth node is connected to the drain of said first, second-conductive field-effect transistor.

7. A complementary signal generation circuit according to claim 1, further comprising:

a third RC series circuit including
a third transfer gate including a first-conductive field-effect transistor, the source of which is connected to a fifth node, the gate of which is connected to said second power source and the drain of which is connected to a sixth node, and a second-conductive field-effect transistor, the source of which is connected to said fifth node, the gate of which is connected to said first power source and the drain of which is connected to said sixth node, and
a capacitor connected to said fifth node, wherein said sixth node is connected to the drain of said second, second-conductive field-effect transistor; and a fourth RC series circuit including
a fourth transfer gate including a first-conductive field-effect transistor, the source of which is connected to a seventh node, the gate of which is connected to said second power source and the drain of which is connected to an eighth node, and a second-conductive field-effect transistor, the source of which is connected to said seventh node, the gate of which is connected to said first power source and the drain of which is connected to said eighth node, and
a capacitor connected to said seventh node, wherein said eighth node is connected to the drain of said first, second-conductive field-effect transistor.

8. A complementary signal generation circuit according to claim 1, further comprising:

a third RC series circuit including
a third transfer gate including a first-conductive field-effect transistor, the source of which is connected to a fifth node, the gate of which is connected to said second power source and the drain of which is connected to a sixth node, and a second-conductive field-effect transistor, the source of which is connected to said fifth node, the gate of which is connected to said first power source and the drain of which is connected to said sixth node, and
a capacitor constituted by a second-conductive field-effect transistor, the gate of which is connected to said fifth node and the source and the drain of which are connected to said second power source, wherein said sixth node is connected to the drain of said second, second-conductive field-effect transistor; and a fourth RC series circuit including
a fourth transfer gate including a first-conductive field-effect transistor, the source of which is connected to a seventh node, the gate of which is connected to said second power source and the drain of which is connected to an eighth node, and a second-conductive field-effect transistor, the source of which is connected to said seventh node, the gate of which is connected to said first power source and the drain of which is connected to said eighth node, and
a capacitor constituted by a second-conductive field-effect transistor, the gate of which is connected to said seventh node and the source and the drain of which are connected to said second power source, wherein said eighth node is connected to the drain of said first, second-conductive field-effect transistor.

9. A complementary signal generation circuit according to claim 1, further comprising:

a first inverter, the input terminal of which is connected to the drain of said first, second-conductive field-effect transistor and the output of which is connected to said antiphase signal output terminal; and a second inverter, the input terminal of which is connected to the drain of said second, second-conductive field-effect transistor and the output terminal of which is connected to said in-phase signal output terminal.

10. A complementary signal generation circuit comprising:

a complementary signal generator for generating an antiphase signal from an input signal, input at a signal input terminal, and outputting said antiphase signal from a first internal signal terminal, and for generating an in-phase signal from said input signal and outputting said in-phase signal from a second internal signal terminal;

a flip-flop, including:
  a first, first-conductive field-effect transistor, the source of which is connected to a first power source,
  a second, first-conductive field-effect transistor, the source of which is connected to said first power source,
  a first, second-conductive field-effect transistor, the source of which is connected to a second power source and the drain of which is connected to the drain of said first, first-conductive field-effect transistor and the gate of said second, first-conductive field-effect transistor, and
  a second, second-conductive field-effect transistor, the source of which is connected to said second power source and the drain of which is connected to the drain of said second, first-conductive field-effect transistor and the gate of said first, first-conductive field-effect transistor;

a first RC series circuit including
  a first transfer gate including a second-conductive field-effect transistor, the source of which is connected to a first node, the gate of which is connected to a third power source and the drain of which is connected to a second node, and
  a capacitor connected to said first node;

a second RC series circuit including
  a second transfer gate including a second-conductive field-effect transistor, the source of which is connected to a third node, the gate of which is connected to said third power source and the drain of which is connected to a fourth node, and
  a capacitor connected to said third node;

an in-phase signal output terminal for outputting an in-phase signal to the outside; and an antiphase signal output terminal for outputting an antiphase signal to the outside,
  wherein said first internal signal is connected to the gate of said first, second-conductive field-effect transistor and said second node, said second internal signal terminal is connected to the gate of said second, second-conductive field-effect transistor and said fourth node, the drain of said first, second-conductive field-effect transistor is connected to said in-phase output terminal, and the drain of said second, second-conductive field-effect transistor is connected to said antiphase signal output terminal, wherein said first power source supplies a higher voltage than said third power source.

* * * * *